(12) United States Patent
Lee et al.

(10) Patent No.: US 8,847,654 B2
(45) Date of Patent: Sep. 30, 2014

(54) CONTROLLING CIRCUIT FOR ANALOG MEASUREMENT MODULE AND CONTROLLING MODULE THEREOF

(75) Inventors: Yang-Han Lee, Taoyuan County (TW); Yung-Yu Wu, New Taipei (TW); Huei-Huang Chen, New Taipei (TW)

(73) Assignee: Princeton Technology Corporation, Xindian Dist., New Taipei (TW)

( * ) Notice: Subject to any disclaimer, the term of this patent is extended or adjusted under 35 U.S.C. 154(b) by 767 days.

(21) Appl. No.: 13/167,730

(22) Filed: Jun. 24, 2011

(65) Prior Publication Data

US 2012/0163798 A1    Jun. 28, 2012

(30) Foreign Application Priority Data

Jun. 25, 2010   (TW) ................................. 99120953 A

(51) Int. Cl.
 *H03L 5/00* (2006.01)
 *G01R 15/22* (2006.01)
(52) U.S. Cl.
 CPC ....................................... *G01R 15/22* (2013.01)
 USPC ......................................... 327/306; 327/356

(58) Field of Classification Search
 USPC .................................................. 327/306, 356
 See application file for complete search history.

(56) References Cited

U.S. PATENT DOCUMENTS

| | | | |
|---|---|---|---|
| 5,815,580 A * | 9/1998 | Craven et al. | .................... 381/58 |
| 8,723,527 B2 * | 5/2014 | Kudo et al. | .................... 324/433 |
| 2012/0128134 A1 * | 5/2012 | Pappas et al. | ................. 379/1.01 |
| 2012/0163798 A1 * | 6/2012 | Lee et al. | .......................... 398/9 |
| 2014/0010379 A1 * | 1/2014 | Wellman | ......................... 381/58 |
| 2014/0123166 A1 * | 5/2014 | Johnson | .......................... 725/18 |
| 2014/0159739 A1 * | 6/2014 | Kudo et al. | .................... 324/434 |

* cited by examiner

*Primary Examiner* — Adam Houston
(74) *Attorney, Agent, or Firm* — Winston Hsu; Scott Margo

(57) ABSTRACT

In a controlling circuit, a photo coupler is used for isolating noises, and a general purpose amplifier is used for adjusting a gain, so that a logic tester may test analog signals in cooperation with relays having different specifications and operating voltage level differences in an analog measurement module. A shift register of each controlling circuit of a controlling module also transmits a test data signal to a next stage controlling circuit, so that a logic tester may simultaneously output a plurality of bits to multiple controlling circuits and multiple analog measurement modules by using merely one I/O port.

13 Claims, 3 Drawing Sheets

US 8,847,654 B2

CONTROLLING CIRCUIT FOR ANALOG MEASUREMENT MODULE AND CONTROLLING MODULE THEREOF

BACKGROUND OF THE INVENTION

1. Field of the Invention

The present invention discloses a controlling circuit for an analog measurement module and a controlling module thereof, and more particularly, to a controlling circuit of isolating noises with the aid of a photo-coupler and of providing a required operating voltage level difference with the aid of a general purpose amplifier and a controlling module including at least one said controlling circuit.

2. Description of the Prior Art

Please refer to FIG. 1, which illustrates a conventional logic tester 110 and an analog measurement module 120 in cooperation with the logic tester 110 for audio measurement. As shown in FIG. 1, the logic tester 110 outputs a control signal to the analog measurement module 120 for measurement and test of AC small signals. The analog measurement module 120 is conventionally provided with a low-noise power, so as to reduce noise coupling from an external power. Since the analog measurement module is often required to test audio signals having different levels of magnitudes, the control signal from a single I/O port of the logic tester 110 is also required to be amplified in its magnitude with different gains, so as to retrieve audio signals having qualified magnitudes for testing. The analog measurement module 120 includes a relay, which is not illustrated herein for brevity, for serving as a switch for selecting amplifiers having different gains. The relay is capable of switching amplifiers having different gains according to a voltage level difference between an input control signal and a DC voltage source, so as to meeting requirements of audio signals having different ranges of magnitudes. The analog measurement module 120 is coupled to an analog ground AGND, and the logic tester 110 is coupled to a DC ground DGND. However, in considerations of various requirements of the analog measurement module 120 in its specifications, the requirements cannot be met by the logic tester 110 since said logic tester 110 can merely transmit control signals with a single I/O port. Besides, the control signal may be coupled to an analog measurement module 120 having unmatched specifications so that noises are introduced; and as a result, measurements of the analog measurement module 120 may be unstable or getting larger so that errors and higher fabrication capitals are both introduced.

SUMMARY OF THE INVENTION

The claimed invention discloses a controlling circuit for an analog measurement module. The controlling circuit comprises a shift register, a photo-coupler, and a general purpose amplifier. The shift register is used for receiving an external data signal, and for generating a plurality of bits according to the external data signal. The photo-coupler is coupled to the shift register, for transmitting the plurality of bits through photo-transmission. The general purpose amplifier is coupled to the photo-coupler, for receiving the transmitted plurality of bits from the photo-coupler, and for outputting the plurality of bits to an analog measurement module.

The claimed invention discloses a controlling system for an analog measurement module. The controlling system comprises a logic tester, at least one controlling circuit, and at least one analog measurement module. The logic tester is used for generating a test data signal. The at least one controlling circuit is coupled to the logic tester, for receiving the test data signal. The at least one analog measurement module is coupled to the at least one controlling circuit in a one-by-one correspondence. Each of the at least one analog measurement module is used for testing a corresponding element-under-test. The at least controlling circuit transmits the test data signal to the analog measurement module in a photo-transmission manner.

These and other objectives of the present invention will no doubt become obvious to those of ordinary skill in the art after reading the following detailed description of the preferred embodiment that is illustrated in the various figures and drawings.

DETAILED DESCRIPTION

For neutralizing the conventional problem that a logic tester merely has one single I/O port for outputting control signals so that the logic tester cannot meet various requirements in audio tests of a corresponding analog measurement module, a controlling circuit and a controlling module are disclosed in the present invention. The disclosed controlling circuit isolates noises in the control signal outputted from the logic tester with the aid of a photo-coupler, and adjusts a required gain of the control signal with the aid of a general purpose amplifier. The disclosed controlling module includes a plurality of the disclosed controlling circuit connected in series, so as to cooperate with analog measurement modules having different specifications.

Figure 1:
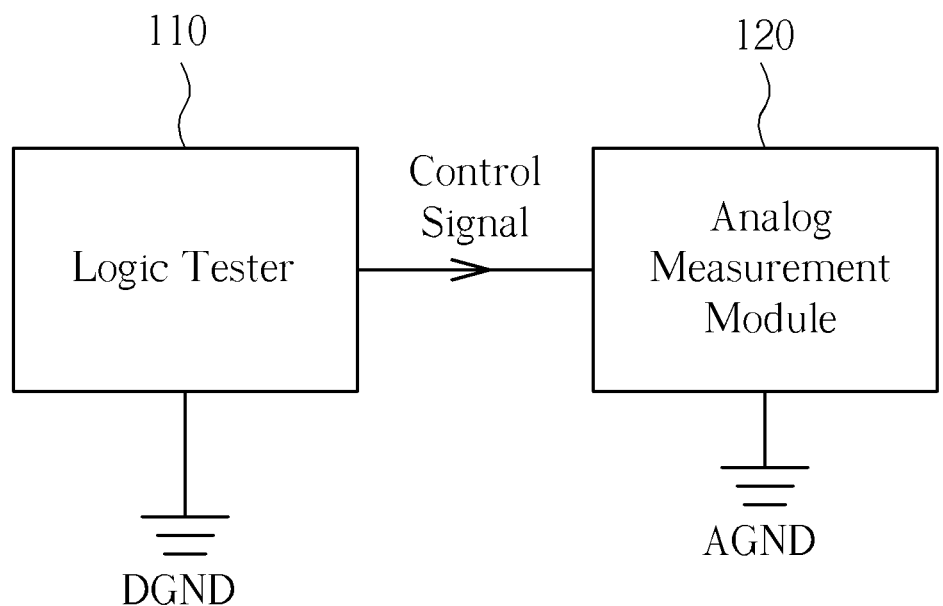
FIG. 1 illustrates a conventional logic tester and an analog measurement module.
Figure 2:
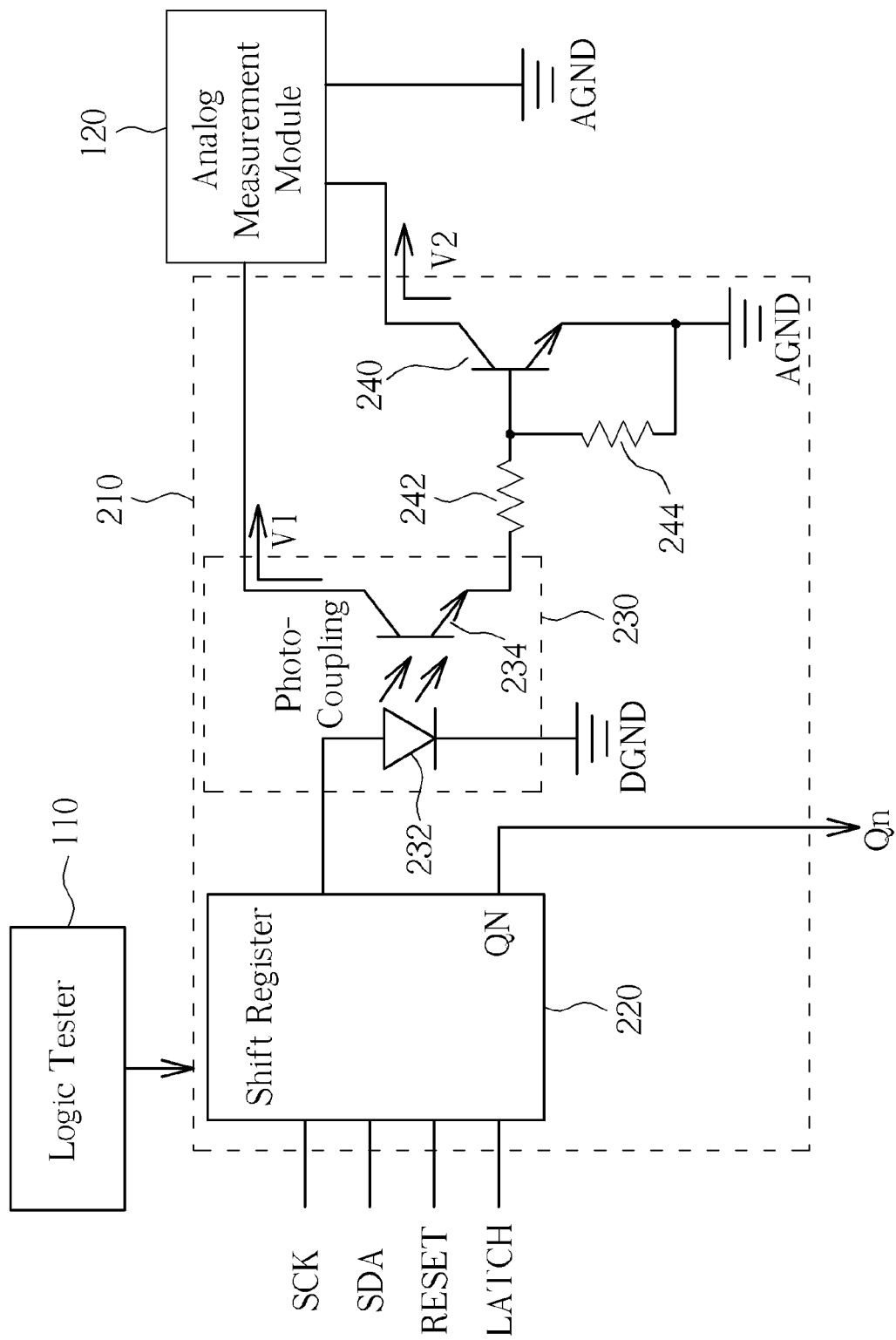
FIG. 2 is a schematic diagram of a controlling circuit of the present invention.

Please refer to FIG. 2, which is a schematic diagram of a controlling circuit 210 of the present invention, where the controlling circuit 210 cooperates with the logic tester 110 shown in FIG. 1. The controlling circuit 210 includes a shift register 220, a photo-coupler 230, a general purpose amplifier 240, and resistors 242 and 244.

As shown in FIG. 2, the shift register 220 is used for receiving four signals including a clock signal SCK, a data signal SDA, a reset signal RESET, and a switch signal LATCH, where the data signal SDA is generated according to the test data signal transmitted from the logic tester 110. The shift register 220 transforms the data signal SDA into a plurality of bits in forms of high/low voltage levels.

The photo-coupler 230 includes a first sensing element 232 and a second sensing element 234. The first sensing element 232 has a first terminal coupled to the shift register 220 for receiving the plurality of buts, and a second terminal coupled to the digital ground DGND. Whether the first sensing element 232 is triggered is determined according to the plurality of bits. The second sensing element 234 is coupled to the first sensing element 232 with a photo-coupling, so that the plurality of bits received by the first sensing element 232 can be transmitted to the second sensing element 234 by means of photo-transmission. The second sensing element 234 has a first terminal coupled to the analog ground AGND through resistors 242 and 244. The second sensing element 234 is used for sensing whether the first sensing element 232 is triggered by the plurality of bits, so as to generate a plurality of signals corresponding to the plurality of bits.

The general purpose amplifier 240 has a switch terminal coupled to the first terminal of the second sensing element 234 through the resistor 242 so as to receive the plurality of signals, and has a reference terminal coupled to the analog ground AGND. The general purpose amplifier 240 is activated according to the plurality of signals, and outputs a second voltage level signal V2 at its output terminal according to whether said general purpose amplifier 240 is activated.

In a preferred embodiment of the present invention, the first sensing element 232 is a photo emitter, for receiving signals outputted from the shift register 220, and for transforming the signals into photo signals; the second sensing element 234 is a photo sensor, for sensing the photo signals transformed by the first sensing element 232, for correspondingly outputting a first voltage level signal V1 to the analog measurement module 120, and for outputting the plurality of signals, which correspond to the plurality of bits, to the general purpose amplifier 240. The sensing element 234 includes an npn photo transmitter. While a bit having a high voltage level passing the first sensing element 232, and when the second sensing element 234 senses said bit, the general purpose amplifier 240 is activated according to said bit. Otherwise, while a bit having a low voltage level passing the first sensing element 232, and when the second sensing element 234 senses said bit, the general purpose amplifier 240 is switched off according to said bit as well. The second sensing element 234 has a second terminal for outputting the first voltage level signal V1 to the relay of the analog measurement module 120, according to the voltage level indicated by the sensed bit. At last, a voltage level difference between the first voltage level signal V1 and the second voltage level signal V2 is used for operating the replay of the analog measurement module 120.

In one embodiment of the present invention, the general purpose amplifier is an npn bipolar junction transistor, which is specifically configured to carry a current being larger than 100 mA in its magnitude, so as to meet requirements of the analog measurement module 120 under a higher gain or a larger current. Therefore, while the second sensing element 234 senses a high-voltage-level bit received by the first sensing element 232 and generates a high-voltage-level signal correspondingly, the general purpose amplifier 240 is activated by the high-voltage-level signal from the second sensing element 234, so that a voltage level of the second voltage level signal V2 is lowered to be close to the analog ground AGND; as a result, the voltage level difference between the first voltage level signal V1 and the second voltage level signal V2 is raised so as to meet requirements of a relay requiring a higher voltage level difference. On the contrary, while the second sensing element 234 senses a low-voltage level bit received by the first sensing element 232, the general purpose amplifier 240 is correspondingly switched off, so that the second voltage level signal V2 outputted from the general purpose amplifier 240 is maintained at a high voltage level because of being isolated from the analog ground AGND; and as a result, the voltage level difference between the first voltage level signal V1 and the second voltage level signal V2 is lowered so as to meet requirements of a relay requiring a smaller voltage level difference.

Besides, since the first sensing element 232 is coupled to the second sensing element 234 in a photo-coupling manner, even if there are noises in the plurality of bits, which are generated from the logic tester 110 and the shift register 220 and pass through the first sensing element 232, said noises are isolated by the photo coupler 230 so that said noises cannot reach the second sensing element 234.

Figure 3:
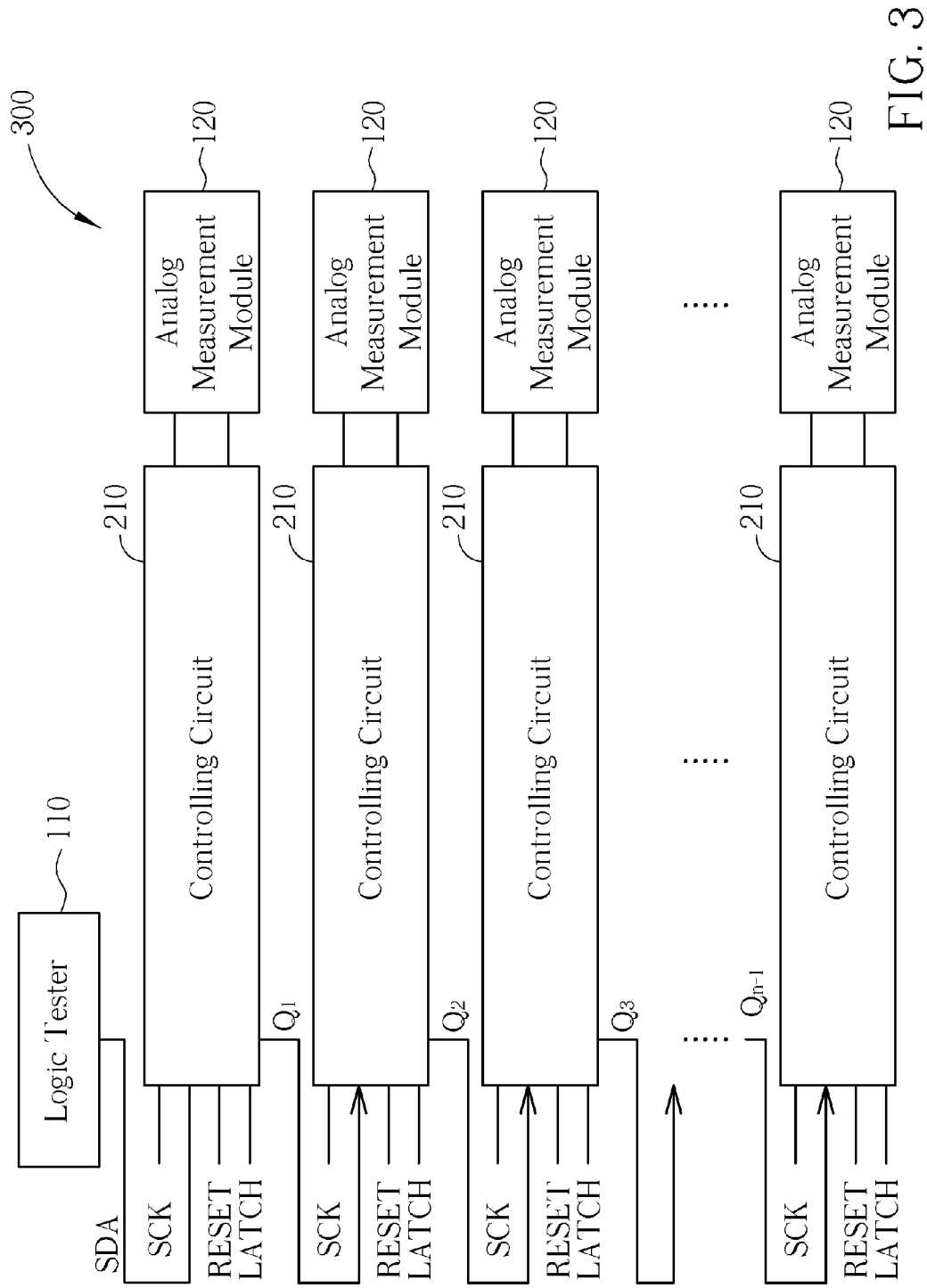
FIG. 3 illustrates a controlling system utilizing the controlling circuit shown in FIG. 2.

Please refer to FIG. 3, which illustrates a controlling system 300 utilizing the controlling circuit 210 shown in FIG. 2.

As shown in FIG. 3, at least one controlling circuit 210 is connected to each other through an output signal Qn outputted from an output terminal QN of the shift register 220, therefore, each of the at least one controlling circuit 210 is capable of transmitting a signal to activate a next-stage controlling circuit 210 while receiving the data signal SDA or one of the output signals $Q_1, Q_2, Q_3, \ldots, Q_{n-1}$. Relays of at least one analog measurement module 120, each of which is coupled to a corresponding controlling circuit 210 and is shown in FIG. 3, are different in required voltage level differences and specifications. However, with the aid of the controlling circuit 210 shown in FIG. 2, noises can be effectively isolated, besides, a purpose of cooperating with relays having different specifications and operating voltage level differences can also be fulfilled by utilizing general purpose amplifiers 240 having different gains. Moreover, since the at least one controlling circuit 210 is connected to each other, the logic tester 110 can be prevented from utilizing multiple I/O ports for coupling to each of the at least one controlling circuit 210 and each of the at least one analog measurement module 120; instead, the logic tester 110 is capable of merely utilizing one single I/O port for simultaneously controlling multiple controlling circuits 210 and multiple analog measurement modules 120.

The present invention discloses a controlling circuit and a controlling module thereof. A logic tester is capable of cooperating with relays having different specifications and different operating voltage level differences with the aid of a photo-coupler, which is used for transmitting bits and isolating noises, and a general purpose amplifier, which is used for adjusting a required gain. Besides, a shift register of each of the at least one controlling circuit in the controlling module is used for transmitting a data signal to a next-stage controlling circuit one-by-one, so that the logic tester is capable of simultaneously outputting a plurality of bits to at least one controlling circuit and at least one analog measurement module, which correspond to the at least one controlling circuit in a one-by-one correspondence, by utilizing merely one I/O port.

Those skilled in the art will readily observe that numerous modifications and alterations of the device and method may be made while retaining the teachings of the invention.

What is claimed is:

1. A controlling circuit for an analog measurement module, comprising:
   a shift register for receiving an external data signal, and for generating a plurality of bits according to the external data signal;
   a photo-coupler coupled to the shift register for transmitting the plurality of bits through photo-transmission; and
   a general purpose amplifier coupled to the photo-coupler for receiving the transmitted plurality of bits from the photo-coupler, and for outputting the plurality of bits to an analog measurement module.

2. The controlling circuit of claim 1, wherein the photo-coupler comprises:
   a first sensing element coupled to a digital ground, the first sensing element receiving the plurality of bits transmitted from the shift register and transforming the plurality of bits into corresponding photo signals; and
   a second sensing element coupled between the first sensing element and an analog ground, the second sensing element generating a first voltage level signal according to the photo signals corresponding to the transformed plurality of bits.

3. The controlling circuit of claim 2,
   wherein the first sensing element has a first terminal connected to the shift register so as to receive the plurality of bits, a second terminal connected to the digital ground, and whether the first sensing element is triggered is determined according to the plurality of bits;

wherein the second sensing element is coupled to the first sensing element in a photo-coupling manner;

wherein a first terminal of the second sensing element is coupled to the analog ground and a second terminal of the second sensing element outputs the first electrical signal; and wherein the first sensing element senses whether the first sensing element is triggered by the plurality of bits, so as to generate a plurality of signals corresponding to the plurality of bits.

4. The controlling circuit of claim 3, wherein the general purpose amplifier includes a switch terminal coupled to the first terminal of the second sensing element so as to receive the plurality of signals, a reference terminal coupled to the analog ground, and an output terminal for outputting a second electrical signal;

wherein whether the general purpose amplifier is activated is determined according to the plurality of signals.

5. The controlling circuit of claim 4, wherein the general purpose amplifier includes a npn bipolar junction transistor, the switch terminal of the general purpose amplifier is a base of the npn bipolar junction transistor, the reference terminal of the general purpose amplifier is an emitter of the npn bipolar junction transistor, and the output terminal of the general purpose amplifier is a collector of the npn bipolar junction transistor.

6. The controlling circuit of claim 4, further comprising:

a first resistor having a first terminal coupled to the first terminal of the second sensing element, and a second terminal coupled to the switch terminal of the general purpose amplifier; and a second resistor having a first terminal coupled to the second terminal of the first resistor, and a second terminal coupled to the analog ground.

7. A controlling system for an analog measurement module, comprising:

a logic tester for generating a test data signal;

at least one controlling circuit coupled to the logic tester for receiving the test data signal; and at least one analog measurement module coupled to the at least one controlling circuit in a one-by-one correspondence, each of the at least one analog measurement module being used for testing a corresponding element-under-test;

wherein the at least controlling circuit transmits the test data signal to the analog measurement module in a photo-transmission manner.

8. The controlling system of claim 7, wherein each of the at least one controlling circuit comprises:

a shift register for receiving the test data signal and generating a plurality of bits according to the test data signal;

a photo-coupler coupled to the shift register for transmitting the plurality of bits by photo-transmission; and a general purpose amplifier coupled to the photo-coupler for receiving the plurality of bits from the photo-coupler and outputting the plurality of bits to a corresponding analog measurement module.

9. The controlling system of claim 8, wherein the photo-coupler comprises:

a first sensing element coupled to a digital ground, the first sensing element receiving the plurality of bits transmitted from the shift register and transforming the plurality of bits into corresponding photo signals; and a second sensing element coupled between the first sensing element and an analog ground, the second sensing element generating a first voltage level signal according to the photo signals corresponding to the plurality of bits.

10. The controlling system of claim 9, wherein the first sensing element includes a first terminal connected to the shift register so as to receive the plurality of bits, a second terminal connected to the digital ground;

wherein whether the first sensing element is triggered is determined according to the plurality of bits;

wherein the second sensing element is coupled to the first sensing element in a photo-coupling manner, which has a first terminal coupled to the analog ground, a second terminal for outputting the first electrical signal, and wherein the second sensing element senses whether the first sensing element is triggered by the plurality of bits, so as to generate a plurality of signals corresponding to the plurality of bits.

11. The controlling system of claim 10, wherein the general purpose amplifier includes a switch terminal coupled to the first terminal of the second sensing element so as to receive the plurality of signals, a reference terminal coupled to the analog ground, an output terminal for outputting a second electrical signal;

wherein whether the general purpose amplifier is activated is determined according to the plurality of signals.

12. The controlling system of claim 11, wherein the general purpose amplifier includes a npn bipolar junction transistor, the switch terminal of the general purpose amplifier is a base of the npn bipolar junction transistor, the reference terminal of the general purpose amplifier is an emitter of the npn bipolar junction transistor, and the output terminal of the general purpose amplifier is a collector of the npn bipolar junction transistor.

13. The controlling system of claim 11, further comprising:

a first resistor having a first terminal coupled to the first terminal of the second sensing element, and a second terminal coupled to the switch terminal of the general purpose amplifier; and a second resistor having a first terminal coupled to the second terminal of the first resistor and a second terminal coupled to the analog ground.

* * * * *